(12) United States Patent
Clark (10) Patent No.: US 6,452,377 B1
(45) Date of Patent: Sep. 17, 2002

(54) PHASE METER USING A PERMUTER AND MATCHED FILTER

(75) Inventor: James M. Clark, Verona, NJ (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 4 days.

(21) Appl. No.: 09/710,968

(22) Filed: Nov. 13, 2000

Related U.S. Application Data (60) Provisional application No. 60/164,954, filed on Nov. 12, 1999, and provisional application No. 60/164,953, filed on Nov. 12, 1999.

(51) Int. Cl.[7] .............................................. G01R 23/16
(52) U.S. Cl. ................................. 324/76.58; 324/76.53
(58) Field of Search .......................... 324/76.52, 76.53, 324/76.55, 76.58, 76.68, 76.82; 327/552; 375/362

(56) References Cited

U.S. PATENT DOCUMENTS

| | | | | |
|---|---|---|---|---|
| 3,185,958 A | * | 5/1965 | Masterson et al. ............... 360/6 |
| 3,777,133 A | * | 12/1973 | Beck et al. ............... 324/76.33 |
| 3,787,765 A | * | 1/1974 | Morrow et al. ........... 324/76.83 |
| 4,001,682 A | * | 1/1977 | Watt ......................... 324/76.47 |
| 4,068,311 A | * | 1/1978 | Whitehouse et al. ........ 327/552 |
| 4,654,586 A | * | 3/1987 | Evans et al. .............. 324/76.47 |
| 4,685,132 A | * | 8/1987 | Bishop et al. ................. 341/95 |
| 4,712,060 A | * | 12/1987 | Bailey et al. ............. 324/76.77 |
| 4,723,282 A | * | 2/1988 | Marie et al. ................. 380/215 |
| 4,885,554 A | * | 12/1989 | Wimmer ...................... 327/157 |
| 5,345,440 A | * | 9/1994 | Gledhill et al. .............. 370/210 |

* cited by examiner

*Primary Examiner*—N. Le
*Assistant Examiner*—Vincent Q. Nguyen
(74) *Attorney, Agent, or Firm*—Epstein, Edell, Shapiro, Finnan & Lytle, LLC (57) ABSTRACT

A phase meter precisely measures the phase of two signals with very different frequencies by using a sampler, permuter and a matched filter. The phase meter includes a sampler that samples the fast clock with the slow clock; a permuter that permutes the samples based on the frequencies of the fast and slow clocks; and a matched filter that sums sequences of the samples and generates maximum and minimum phase positions. The maximum and minimum phase positions indicate transition times in the fast clock. The filter can take the average of the minimum and maximum values to determine the phase of the fast clock at the middle point of a cycle. The phase meter can also be used with an interval counter to precisely adjust the transition count used by the interval counter to detect a number of cycles in the interval, and to account for partial cycles that fall within the interval.

16 Claims, 11 Drawing Sheets

FIG.13A

PHASE METER USING A PERMUTER AND MATCHED FILTER

CROSS REFERENCE TO RELATED APPLICATION

This application claims priority from U.S. Provisional Patent Application Ser. No. 60/164,954, entitled "Phase Meter, Using A Permuter And Matched Filter," and No. 60/164,953, entitled "Phase Meter, Using A Permuter And Bin Counters," both filed Nov. 12, 1999. The disclosures of these provisional patent applications is incorporated herein by reference in their entirety.

BACKGROUND OF THE INVENTION

1. Field of the Invention

The present invention relates to timing systems, and, more particularly, to methods and apparatuses for measuring phase differences between signals and adjusting interval counters based on the measured phase differences.

2. Description of the Related Art

Timing and digital communication systems routinely use internal clocks to generate reference signals. Those systems use the reference signals to keep time and to generate other signals and codes used to communicate with other devices. In such systems there is a need to know the phases of the internal clocks to synchronize them with other clocks in transmitters and receivers in the communications system.

One timing system that uses frequency standards as timing sources is the Global Positioning System (GPS). The GPS system is a satellite-based spread-spectrum communications system that transmits coded signals from the satellites for use by receivers to determine their position and the time. The GPS satellites use redundant atomic frequency standards (AFS), i.e., atomic clocks, on each satellite as the basis for accurate timing with long-term stability. The atomic frequency standards include Cesium beam frequency standards, or Rubidium based frequency standards. In the GPS satellites the AFS signal is a very accurate signal with a frequency of nearly 13.4 MHz. However, the AFS frequency is determined by the physical attributes of the Cesium or Rubidium atoms, and is not precisely related by any simple ratio of integers to common time-keeping, which is based on the rotation of the earth. Furthermore, the atomic frequency standards are not easily tuned (adjusted).

Each GPS satellite also uses a less stable, but adjustable frequency source, namely, a voltage-controlled crystal oscillator (VCXO) to generate a 10.23 MHz "system clock" which is used to generate timing signals used in the satellite to control the timing of navigation signals broadcast from the satellites. Although the system clock is not sufficiently stable by itself, it is adjustable; and by continually adjusting it using information obtained by comparison with the AFS frequency, the adjusted system clock can obtain the stability of the AFS. By comparing the 10.23 MHz system clock with the very accurate 13.4 MHz AFS clock signal, errors in the system clock can be determined and adjusted. Each GPS satellite uses a phase meter to compare these two clocks and to adjust the system clock. The phase meter data can also be used to monitor the AFS performance, to adjust the satellite timing to follow a world-wide time standard, and/or to create an ensemble clock, that is, to average the timing of multiple atomic clocks from one or more satellites, thus obtaining a virtual clock that is better than any one atomic clock alone.

In many applications, such as in GPS, the phase of a signal and its phase change must be measured with a high degree of precision because of the need to generate the highly stable frequency signals. In some applications where transmitters and receivers are widely distributed and those devices must remain closely synchronized for communications or other purposes, phase meters can be used to help maintain that synchronization. However, in many instances the precision of conventional phase meters is inadequate, thereby inhibiting the development of such systems. In other cases, high precision phase meters are too expensive for certain applications, or the technology used to build conventional high precision phase meters is incompatible with more economical technologies, thereby hindering large scale integration (LSI) of the phase meter.

Conventional methods for detecting a phase difference between two frequency signals, such as the 10.23 MHz GPS system clock and the 13.4 MHz AFS clock, use another clock signal that is very fast with respect to both of the other two frequency signals. Time is measured by counting the cycles of the very fast clock. That fast clock, however, must be as fast as possible, and thus becomes very expensive to achieve even modest precision. A problem with using the fast clock is that the logic technology enabling the clock to operate so fast is expensive making it infeasible to combine that fast logic with more economical logic technology used in large scale integration (LSI). That fast logic technology also consumes more power than does slower, more conventional logic technologies. An effect of the increased power consumption is that the size and weight of ancillary components such as power supplies and drivers must be increased. As a result, the fast logic required by conventional phase meters inhibits the integration of those phase meters with other less expensive logic technology. It also makes it infeasible to include additional phase meters in the satellite for measuring the phase of other signals such as the output of a back-up atomic clock.

Accordingly, there is a need to measure two or more clock frequency signals precisely and economically without requiring use of a faster clock signal in the measurement.

SUMMARY OF THE INVENTION

Therefore, in light of the above, and for other reasons that become apparent when the invention is fully described, an object of the present invention is to measure a phase difference between two clock signals of very different frequencies with a high degree of precision without requiring a separate fast clock signal.

A further object of the present invention is to determine the phase difference between two clock signals using economical logic technologies.

Yet a further object of the present invention is to detect the phase difference between two clock signals using a circuit implemented on an integrated circuit.

A still further object of the present invention is to measure the phase difference between two clock frequencies that are not very different from one another.

Another object of the present invention is to adjust an interval counter counting cycles of one of the clocks to be measured.

Yet another object of the present invention is to make a phase meter light-weight and that consumes little power.

The aforesaid objects are achieved individually and in combination, and it is not intended that the present invention be construed as requiring two or more of the objects to be combined unless expressly required by the claims attached hereto.

In accordance with the present invention, a phase meter measures the phase of a first signal with respect to a second signal. The phase meter includes a sampler that samples the first signal based on the second signal and outputs samples. It also includes a permuter that is coupled to the sampler, and permutes the samples based on the frequencies of the first and second signals. The permuter permutes the samples according to the formula j=A*i modulo C1, where C2/C1 approximates F1/F2, C1 and C2 are integers, F1 is a frequency of the first signal, F2 is a frequency of the second signal, and A=C2 modulo C1. The phase meter also includes a filter coupled to the permuter, that filters the permuted samples and outputs a phase measurement signal indicating the phase of the first signal.

In accordance with another embodiment of the invention, the phase meter can include an interval counter that determines the number of cycles of the first signal within an interval. It determines the number of cycles based on a number of transitions in the first signal determined from the samples. A count adjuster that is coupled to the interval counter, the sampler and matched filter, adjusts the number of cycles determined by the interval counter, based on the phase measurement signal and the samples. The count adjuster outputs an interval measurement signal that precisely reflects the full and part cycles within the interval, and therefore precisely measures the interval.

In accordance with yet another embodiment of the invention there is a method of measuring the phase of a first signal with respect to a second signal, where the two signals have very different frequencies. The method includes sampling the first signal with the second signal; permuting the samples based on the frequencies of the signals; filtering the permuted samples and outputting a phase measurement signal based on the filtered permuted samples.

The above and still further objects, features and advantages of the present invention will become apparent upon consideration of the following descriptions and descriptive figures of specific embodiments thereof. While these descriptions go into specific details of the invention, it should be understood that variations may and do exist and would be apparent to those skilled in the art based on the descriptions herein.

DESCRIPTION OF THE PREFERRED EMBODIMENTS

Preferred embodiments according to the present invention are described below with reference to the above drawings, in which like reference numerals designate like components.

Overview

Most phase meters compare clocks of equal (or nearly equal) frequency, or are easily adapted when, for example, one clock is twice the frequency of the other. For example, the faster clock can be divided by two to get equal clocks to compare. However, there is a need to compare the phase of signals that have very different frequencies, that are not easily measured merely by dividing the frequency of one signal to obtain the frequency of another signal. An example of this need is with GPS satellites where the phase of the 10.23 MHZ system clock must be measured with respect to the 13.4 MHZ AFS signal. The present invention enables such phase measurements when the clock frequencies to be measured are unequal and very different from one another. Most conventional digital phase measurement methods typically use counters, and require the measurement logic to run much faster than the clocks being measured. This limits the applicability to slow clocks. A phase meter according to the present invention can run slower than the clocks being measured. The smallest measurable time achieved by a phase meter according to the invention is much smaller than the period of any of the clocks used, and hence, a high degree of precision is achieved by the inventive phase meter. Conventional phase meters also require the measurement process to extend over a very large number of clock cycles in proportion to the desired precision. The inventive phase meter makes measurements more quickly, allowing observation of faster phase changes.

An application of the phase meter according to the invention is to measure with extraordinary precision the phase between clocks with dissimilar frequencies. Another application of the phase meter is to adjust an interval counter to avoid ambiguous counts.

Although two exemplary clocks are referred to in the descriptions below, namely the "10.23 MHZ system clock" and the "13.4 MHZ AFS clock", the invention is not limited to only measuring signals of those frequencies. Rather, those frequencies are used here merely to illustrate the invention. More generally, the inventive phase meter directly applies to any two clocks with very different frequencies F1 and F2, in which the ratio F1/F2 is not exactly equal to any ratio of integers N1/N2 where N1 and N2 are small relative to the desired precision.

In a situation where the two clock frequencies are not very different the phase meter can be indirectly applied as follows. An oscillator with frequency F3 can be added to the system, with F3 chosen such that F1 and F3 are very different, and F2 and F3 are very different. The oscillator should have good short-term stability, but need not be accurate. Use two phase meters, one to measure the phase difference between F1 and F3, and the another to measure the phase difference between F2 and F3. Subtract those measured phase differences to determine the phase difference between F1 and F3.

Figure 1:
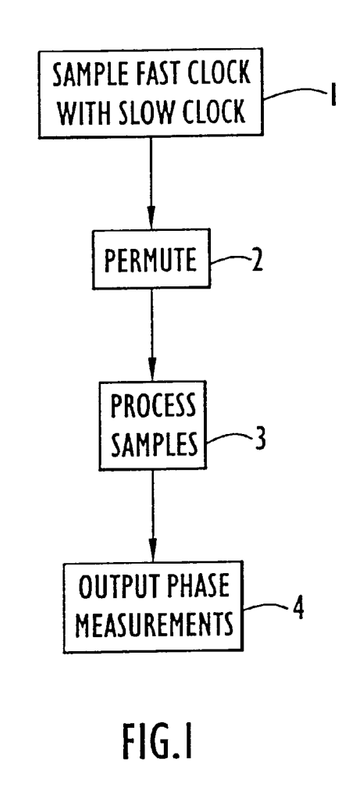
FIG. 1 is a flow diagram illustrating the major operations in measuring a signal's phase according to the invention.

The phase meter here generally operates according to the flowchart shown in FIG. 1. The phase meter will measure the phase difference between two signals with different frequencies, F1 and F2. One of those signals will have a lower frequency F1 than the frequency F2 of the other signal. Hence, the signal with the higher frequency F2 is referred to as the fast clock, and the signal with the lower frequency F1 is referred to as the slow clock. In operation 1, shown in FIG. 1, the slow clock is used to sample the fast clock. This sampling produces a set of samples of the fast clock, where the samples have a value (i.e., a "1" or a "0"), and an associated sampling time, or phase position within a cycle of the fast clock. In operation 2 the samples are permuted, as discussed in more detail below. Permuting arranges the samples in a convenient order to assist processing the samples. The permuted samples are processed in operation 3 to determine the phase of the fast clock with respect to the slow clock, and in operation 4 the phase meter outputs a phase measurement.

An interval counter counts the number of cycles of the "AFS clock" that occur in so many cycles of the "system clock" (15,345,000 cycles, in this case, called an 'epoch'), which is a frequency ratio measurement. This is not actually an integer, but a counter will, of course, provide only an integer, which approximates the true value. Suppose 100 such measurements are made, starting the next measurement the moment that each measurement is completed. The sum of the 100 counts should be the same as if one continuous measurement were made, but because of the approximations, the sum may be 50, perhaps 100, too high, or equally low. An application of the phase meter is described that adjusts the interval counter so that the sum of counts is just as accurate as if done as one continuous count. In fact, the difference of the phase measurements taken at the beginning and at the end of the counting interval may be interpreted as a fraction to be added to the adjusted count, such that the count plus fraction more closely approximates the true value of the interval.

Sampling

Figure 2:
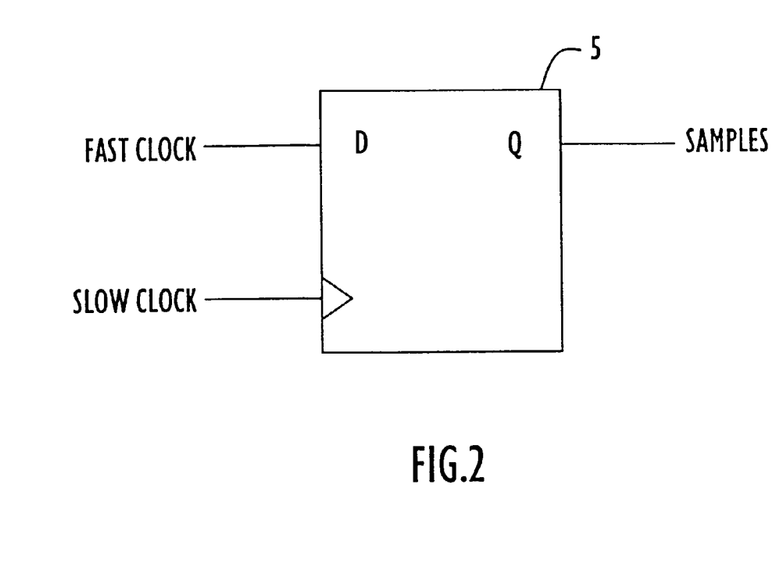
FIG. 2 is a diagram of a sampler according to the invention.

The phase meter uses the slow clock having a frequency F1 to sample the fast clock having a frequency F2. In the case of a GPS satellite, the 10.23 MHZ system clock is used to sample the 13.4 MHZ AFS clock. The samples are bits indicating the state of the AFS clock at the rising edge of the system clock. The sampler can be an edge-triggered flip flop 5 as shown in FIG. 2. Here, the slower clock is connected to the clock input of the flip flop 5 and the faster clock is connected to the data input D, so that the slower clock samples the faster clock. The sample value output at Q is the state of the faster clock at the rising edge of the slower clock.

Alternatively, other clocking methods can be used for the slow clock to sample the fast clock, such as using the falling edge of the slower clock to trigger the sampling of the faster clock.

Permutation

The phase meter permutes the samples to assist in sorting and processing the samples. The permutation relates to the ratio of frequencies of the two clock signals. To perform the permutation the phase meter logic approximates the ratio of the frequency of the slow clock, F1 and the frequency of the fast frequency F2. That is, the phase meter approximates the ratio F2/F1. In the case of a phase meter for use on a GPS satellite, the phase meter approximates the ratio of the 10.23 MHZ system clock and 13.4 MHZ AFS signal with the ratio 131/100. It is noted that this ratio is 3.28 ppm too low for the Rubidium AFS (RAFS), and 71.80 ppm too high for the Cesium AFS (CAFS). This integer ratio of 131/100 applies only to the particular frequencies of the example discussed here. More generally, for each application of the phase meter an appropriate pair of integers (C2/C1) will be used to approximate the ratio F2/F1, where C2 is larger than C1.

Figure 3:
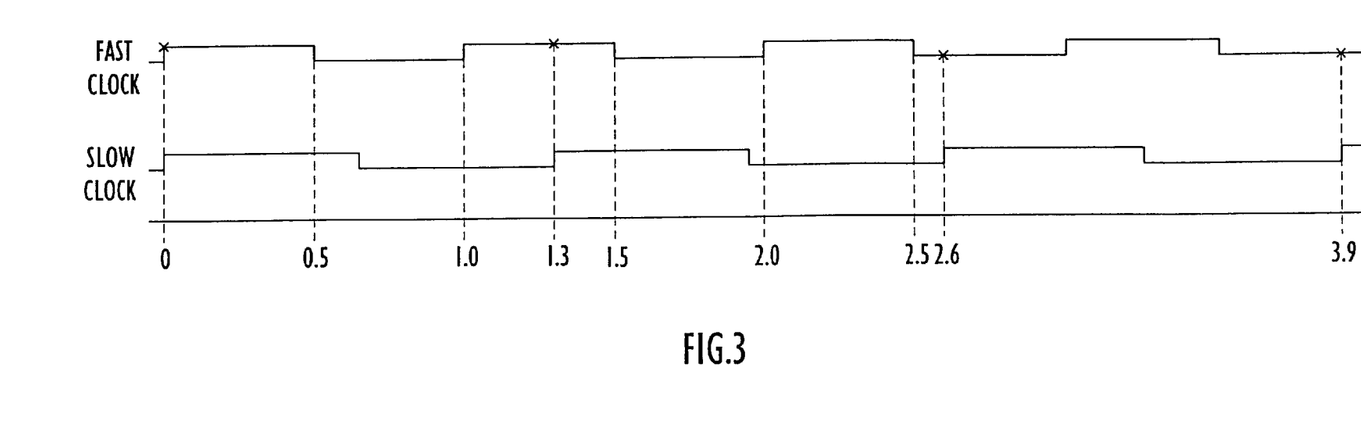
FIG. 3 is a timing diagram illustrating a slow clock sampling a faster clock.

To illustrate how the permutation operates, consider a scaled down version of the integer ratio from 131/100 to 13/10 to make the examples easier to follow. For a point of reference, define time=0 at a point where the rising edges of both clocks align. For convenience, use one AFS cycle as the unit of time, and then the AFS clock will have rising edges at times 0.0, 1.0, 2.0, 3.0, etc. and falling edges at times 0.5, 1.5, 2.5, 3.5, etc., as shown in FIG. 3. If the frequency ratio is actually 13/10, then the system clock will have rising edges at times that are multiples of 1.3. Accordingly, at a rising edge of the system clock the flip flop shown in FIG. 2 is clocked causing the AFS clock input at D to be output at Q, thereby sampling the AFS clock. Those sample points are shown in FIG. 3 with an "x", and the sampling times are set forth in Table 1 below. The table is arranged so as to read the columns in the downward direction, then each row from left Q to right.

TABLE 1

| 0.0 | | | Sample times for 13/10 frequency ratio |
|---|---|---|---|
| 1.3 | 5.2 | 9.1 | |
| 2.6 | 6.5 | 10.4 | |
| 3.9 | 7.8 | 11.7 | |
| | | 13.0 | |

When using the rising edge of the system clock to sample the AFS clock, the sample at time 0.00 will indicate whether the phase is leading or lagging from phase 0.0, the sample at time 1.3 whether leading or lagging from phase 0.3, the sample at 2.6 relative to phase 0.6, etc. For example, the AFS clock phase would need to lag 0.3 cycles to move the rising edge at 1.0 past the sampling time 1.3.

The phases associated with these samples are in each case the integer part of the sampling times. This is illustrated below in Table 2.

TABLE 2

| 0.0 | | | Sample phases for 13/10 frequency ratio |
|---|---|---|---|
| 0.3 | 0.2 | 0.1 | |
| 0.6 | 0.5 | 0.4 | |
| 0.9 | 0.8 | 0.7 | |
| | | 0.0 | (repeats) |

If the table is read by rows right to left, then top to bottom, the phases are in order, and increase by even increments of 0.1 cycles. It should now be apparent that the reason the times and phases are listed in rows and columns this way is to allow an easy visual permutation of the sample sequence. This permutation sequence can be obtained by incrementing by 13 modulo 10, and is useful for arranging the samples in phase order.

However, suppose the actual frequency ratio differs slightly from 13/10; for example, suppose that it is actually 131/100. Then the sample times will be:

TABLE 3

| 0.00 | | | Sample times for 131/100 frequency ratio |
|---|---|---|---|
| 1.31 | 5.24 | 9.17 | |
| 2.62 | 6.55 | 10.48 | |

TABLE 3-continued

| 3.93 | 7.86 | 11.79 |
|------|------|-------|
|      |      | 13.10 | and the corresponding phases will be:

TABLE 4

| 0.00 |      |      | Sample phases for 131/100 frequency ratio |
|------|------|------|-------------------------------------------|
| 0.31 | 0.24 | 0.17 |                                           |
| 0.62 | 0.55 | 0.48 |                                           |
| 0.93 | 0.86 | 0.79 |                                           |
|      |      | 0.10 | (repeats with 0.1 offset)                 |

If the phases are read in the same order as before, by rows leftward from top to bottom, they remain an increasing sequence that is nearly even spaced, but the spacing is more uneven. The uneven spacing of samples is a source of deterministic error, but in the actual design and for typical frequency deviations (even for cold start situations), this error is much less than the quantization error. Clock jitter can also contribute error, but only for samples that are close to an edge.

Sample, Permute and Detect with Matched Filter

Figure 4:
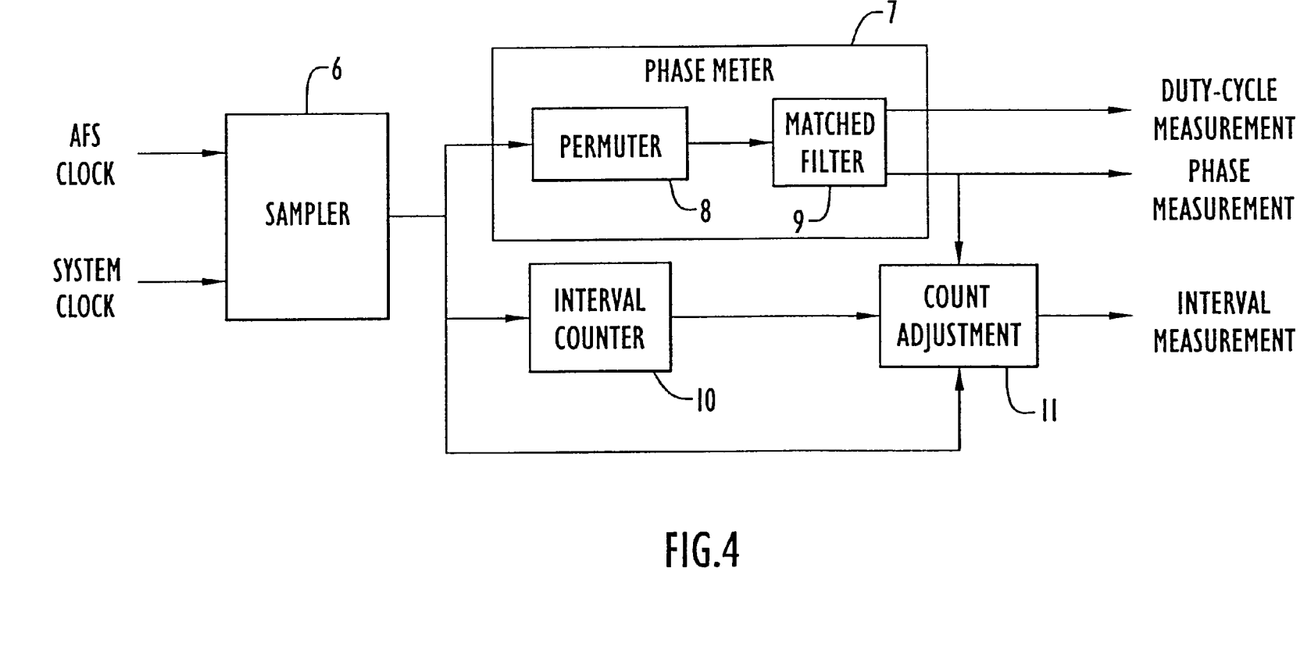
FIG. 4 is a block diagram of a phase meter according to a first embodiment of the invention.

A phase measurement system according to an embodiment of the invention is shown in FIG. 4. The system includes a sampler 6, receiving two clock signals, in this example a 13.4 MHZ AFS clock and a 10.23 MHZ system clock, a phase meter 7 that includes a permuter 8 and a matched filter 9, and an interval counter 10. The system also includes a count adjustment unit 11 for combining the outputs of the phase meter and the interval counter to obtain an interval measurement with the resolution of the phase meter and the range of the interval counter. The phase meter is also able to measure the duty-cycle of the AFS clock, which is useful as an indication of integrity of the phase measurement. The count adjustment unit adjusts the count to remove phase ambiguities.

The phase measurement system will be understood to encompass both hardware and software components.

Phase Meter

The phase meter 7 approximates the ratio of the 10.23 MHZ system clock and 13.4 MHZ AFS signal by the ratio 131/100. In this example, 100 successive samples are taken, and those samples are permuted by moving the ith sample to the jth position, where j=31*i modulo 100. The inverse permutation, i=71*j modulo 100, may also be used, depending on whether the choice is made to have the source position a function of the destination position, or vice versa. The permuted samples include approximately a string of 50 ones followed by a string of 50 zeros in a cyclic sequence, with the phase of this sequence approximating the phase between the two clocks.

Permuter

The permuter 8 changes the sequence of C1 samples, where the positions of the samples before being permuted are designated by i=0, 1, 2 ... C1−1, and the positions of the samples after being permuted are designated by j=0, 1, 2 ... C1−1. More generally, the permutations are performed in this embodiment according to the equations j=A*i modulo C1 and i=B*j modulo C1, where A=C2 modulo C1 and where B=(1/C2) modulo C1 (that is, B*C2 modulo C1=1).

For example (for C2=131 and C1=100), the equation j=31*i modulo 100 is used to compute Table 5 shown below.

TABLE 5

| i | 0 | 1  | 2  | 3  | 4  | 5  | 6  | 7  | 8  | 9  | 10 | 11 | 12 | 13 | 14 | 15 | 16 | 17 | 18 | 19 | 20 | 21 | 22 | 23 | 24 | etc. |
|---|---|----|----|----|----|----|----|----|----|----|----|----|----|----|----|----|----|----|----|----|----|----|----|----|----|------|
| j | 0 | 31 | 62 | 93 | 24 | 55 | 86 | 17 | 48 | 79 | 10 | 41 | 72 | 3  | 34 | 65 | 96 | 27 | 58 | 89 | 20 | 51 | 82 | 13 | 44 | etc. |

Alternatively, the equation i=B*j modulo C1 can be used to compute the position values shown in Table 6 shown below.

TABLE 6

| j | 0 | 1  | 2  | 3  | 4  | 5  | 6  | 7  | 8  | 9  | 10 | 11 | 12 | 13 | 14 | 15 | 16 | 17 | 18 | 19 | 20 | 21 | 22 | 23 | 24 | etc. |
|---|---|----|----|----|----|----|----|----|----|----|----|----|----|----|----|----|----|----|----|----|----|----|----|----|----|------|
| i | 0 | 71 | 42 | 13 | 84 | 55 | 26 | 97 | 68 | 39 | 10 | 81 | 52 | 23 | 94 | 65 | 36 | 7  | 78 | 49 | 20 | 91 | 62 | 33 | 4  | etc. |

Tables 5 and 6 as shown are not complete, but it can be verified that they are correct for some values:
the sample at i=0 is moved to j=0,
the sample at i=4 is moved to j=24,
the sample at i=7 is moved to j=17,
the sample at i=10 is moved to j=10,
the sample at i=13 is moved to j=3,
the sample at i=20 is moved to j=20, and
the sample at i=23 is moved to j=13.

For Table 5, the second row can be obtained by starting at zero and adding 31 (A) to the previous entry, subtracting 100 (C1) whenever the result equals or exceeds 100 (C1). For example, when 31 is added to 93, the result is 124, so 100 is subtracted and 24 is entered for the next table entry.

Figure 5A:
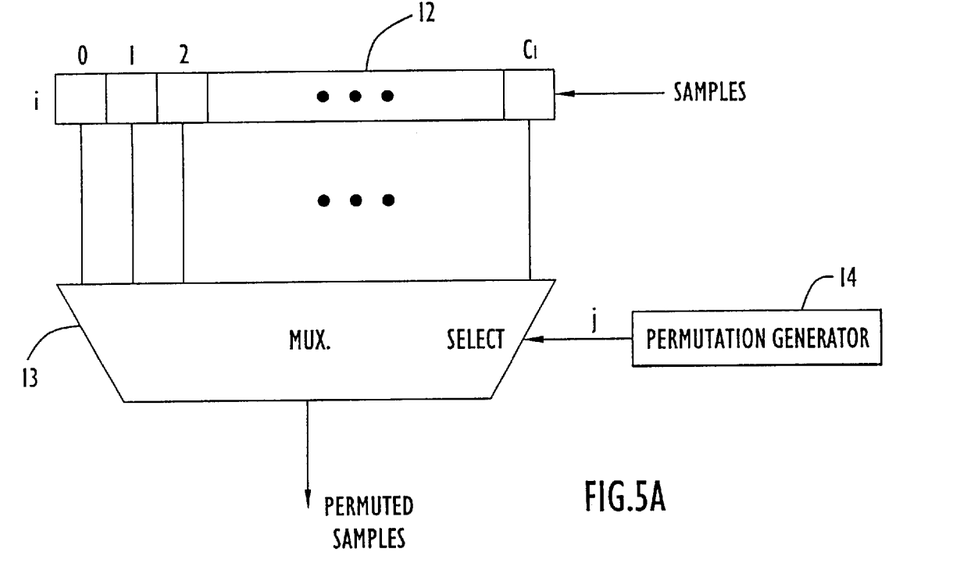
FIG. 5A is a diagram of an embodiment of a permuter according to the invention.

A permuter that performs these permutations can be constructed from a register 12, a multiplexer 13 and permutation generator 14, as shown in FIG. 5A. Samples from the sampler are transferred into a shift register 12 that is C1 bits long. When the shift register is full (i.e., when C1 samples have been loaded), as indicated by a controlling counter, the samples stop shifting into the shift register.

Next, the samples are read from the shift register 12 in a permuted sequence. A multiplexer 13 can be used for reading the register in that manner. The multiplexer 13 is connected to the shift register 6 so that it can select any bit in the shift register. The bits of the shift register, which are the i values, are numbered as follows: 0 is the first bit shifted in (at the far end), 1 is the second bit shifted in, 2 is the third, etc. The multiplexer 13 is connected to the shift register 12 such that the binary integer i at the select input of the multiplexer 13 selects bit i. The samples are to be read in the sequence given by j, as shown in the above tables, and the select input can be connected to a permutation generator 14 that generates that j values shown in Table 5. Thus, the samples are read in the following order: i=0, then i=71, 42, 13, etc.

Figure 5B:
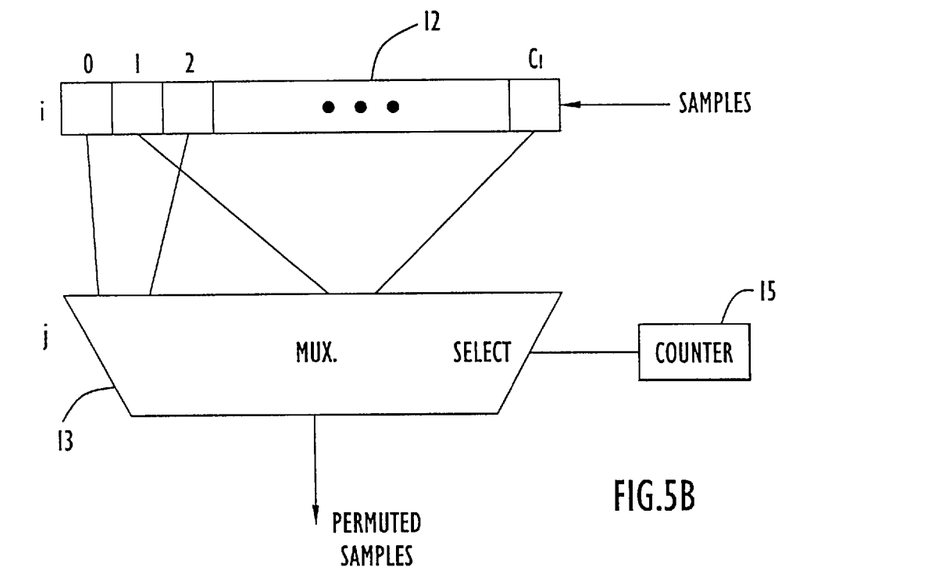
FIG. 5B is a diagram of another embodiment of a permuter according to the invention.

Alternatively, the register 12 and multiplexer 13 can be interconnected so the register position i is connected to an input j of the multiplexer, as shown in FIG. 5B. A counter 15 that counts in sequence, i.e., 0, 1, 2, 3, etc., then can be input to the multiplexer's select input. The multiplexer 13 will then output the i samples according to the sequence j shown in Table 5. In either embodiment the number of samples read must be counted, and for this purpose the earlier described controlling counter can be used.

Figure 6:
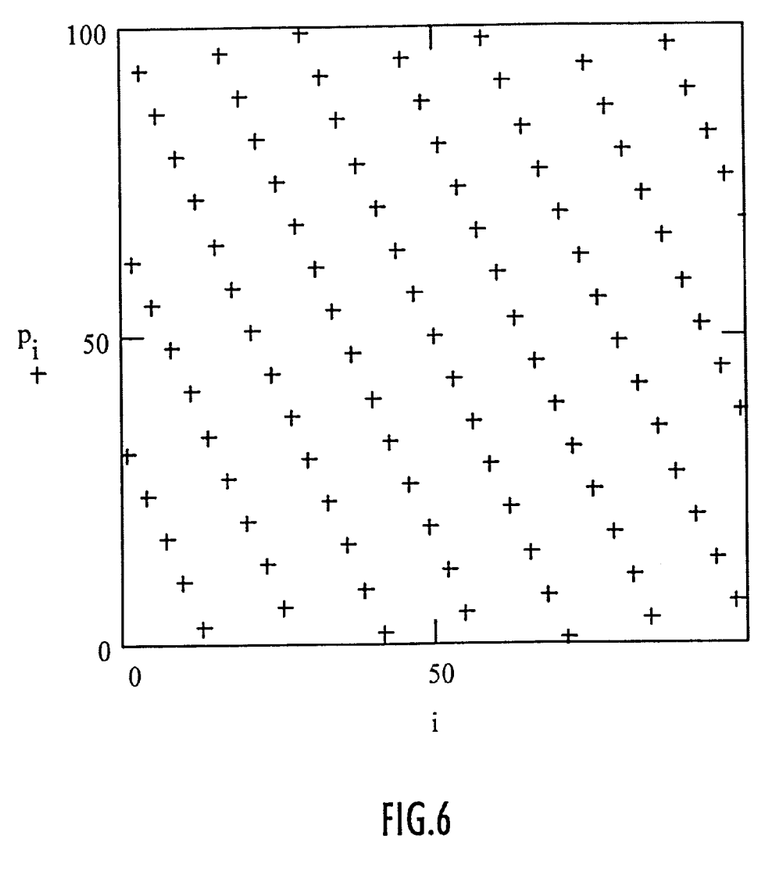
FIG. 6 is a plot showing permuted samples.

A plot of 100 permuted samples is shown in FIG. 6. These samples are permuted by moving the ith sample to the jth position, where j=31*modulo 100. In FIG. 6 the 131/100 permutation follows the formula $p_i=\text{mod}(131*i, 100)$, which is equivalent to $p_i=\text{mod}(3*i, 100)$. This permutation can be used for both the CAFS and the RAFS. The inverse permutation follows the formula $r_i=\text{mod}(71*i, 100)$, because mod (31*71, 100)=1.

Matched Filter

Figure 7:
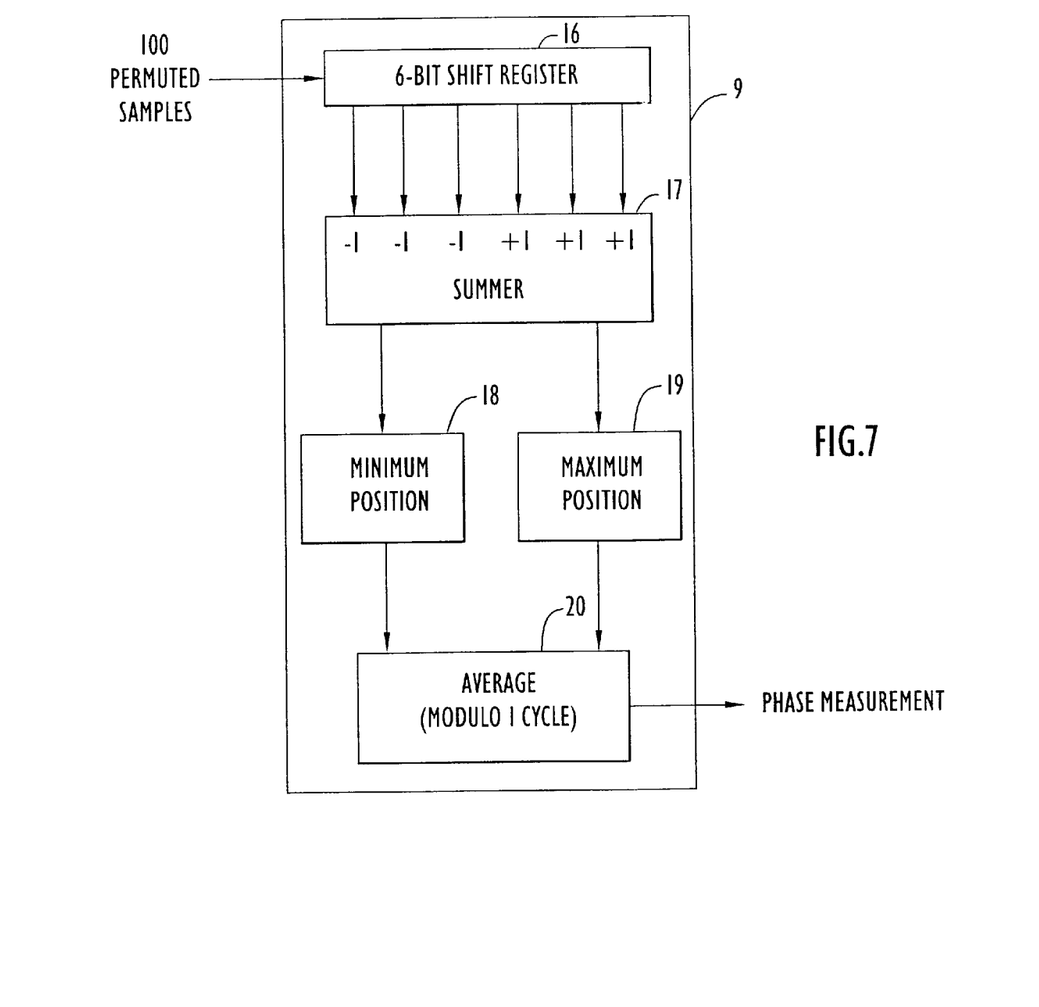
FIG. 7 is a block diagram of a matched filter.
Figure 8A:
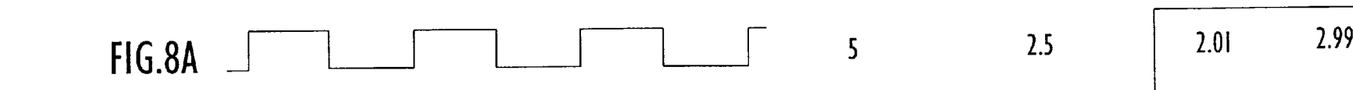
FIGS. 8A–D are waveform diagrams showing various phase offsets of a signal within a count interval.
Figure 8B:
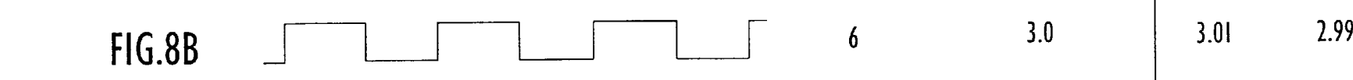
Figure 8C:
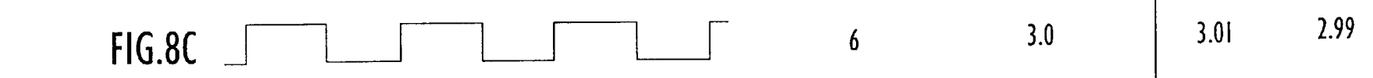
Figure 8D:
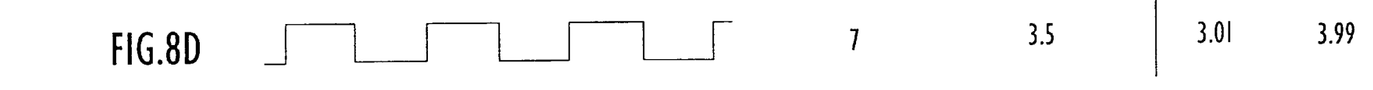

The matched filter 9 operates to detect the sometimes-fuzzy edges of the permuted sample sequence. An embodiment of the matched filter is shown in FIG. 7. It includes a 6-stage FIR filter with weights −1, −1, −1,1,1,1. As shown in FIG. 7, the FIR filter includes a 6-bit shift register 16 receiving the permuted samples, and applies those samples to summer 17 that sums them using the weights noted above. A minimum position unit 18 and maximum position unit 19 process the output of the summer 17 to detect the minimum and maximum position outputs of the filter. The positions of the maximum and minimum outputs of the filter provide redundant phase estimates, which are actually phase measurements of the rising and falling edges of the AFS clock. An averaging unit 20 averages the minimum and maximum phase estimates to obtain a phase measurement with a resolution of 0.005 AFS cycles.

The resulting phase measurement has a small error component that is proportional to the frequency offset from the nominal 131/100 ratio. Software can use the nominal frequency ratio to correct this, if desired, but it does not effect the phase change used to compute an interval measurement.

The matched filter must be operated with modulo-100 arithmetic. First, the processing of the shift register outputs cannot be enabled until the shift register is filled with the first 6 bits of the permuted samples. After shifting and processing the remaining 94 samples, the first 6 bits need to be shifted in again, so that all 100 phase positions can be processed.

The logic to find the minimum filter response, and the logic for the maximum, are similar. Each one needs two registers: one to remember the current min (or max) value, and one for the phase position where the min (or max) was found. The value register can be initialized either to the first filter response value, or to the middle of the value range. During the processing cycle, the value and position registers are loaded with the current value and position whenever a more extreme value is found. It is optional whether such loading is also done when an equal value is found. When there is more than one min (or max), the logic will choose the last one if the option is taken, else the first one. Preferably, the min and max logic blocks should take opposite choices for this option.

The positions of the minimum and maximum filter response correspond to the phase positions of the rising and falling edges of the AFS clock. Averaging these values doubles the phase resolution, providing 200 values per cycle. The averaging also cancels the effect of noise sources that affect rising and falling AFS clock edges oppositely. The average is the sum modulo one cycle, divided by two; but using binary integer representation, we can simply redefine the scale rather than dividing by two. Using the average for the phase measurement establishes the phase reference point midway between the rising and falling edges of the AFS clock. Adding a half-cycle, before dividing by two or changing scale, changes the phase reference point to one of the AFS clock edges, provided that the AFS clock is exactly symmetrical. But when using the phase measurements for interval measurements or for frequency tracking, the absolute phase reference does not matter. Thus, it is not necessary to include hardware that would only redefine the absolute phase reference.

The effect of noise sources that affect rising and falling system clock edges oppositely can also be cancelled, by repeating the phase measurement with the system clock input inverted, then averaging these two measurements. This would also shift the absolute phase reference point and double the phase resolution again.

The difference between the minimum and maximum positions provides a measure of the duty cycle of the AFS clock, and is useful for checking the integrity of the phase meter. For example, if one of the inputs or the sampling circuit would fail, causing all samples to be equal, the duty cycle would be measured as zero.

Interval Counter

An interval counter 10 is connected to sampler 6 and also receives the samples, and thus, the same sequence of samples used to measure phase is also used to drive the counting function. This cooperation helps to resolve phase ambiguities. However, for the counting function, the sampling continues throughout each counting period. In the case of GPS, the counting period is one GPS epoch, which is 1.5 seconds long. If two successive samples differ, as detected by an exclusive-or gate, it indicates that the AFS clock had an odd number of transitions between these two samples. Otherwise there was an even number of transitions. Since the frequency ratio is between 3/2 and 1, the odd number is always 3, and the even number is always 2. Thus, if X ones are counted from the exclusive-or gate during N cycles of the system clock, then this is an indication that the AFS clock had 2*N+X transitions during these N cycles, or X transitions more than the system clock.

To end one counting interval and start another without missing any transitions, the counter is synchronously initialized while the final count is copied to an interface register. A transition near the beginning or end of the counting interval (epoch) is always included in either one counting interval or the next. No transition is ever overlooked, even though the assignment of a transition to a counting interval is sometimes arbitrary, such as when clock edges at the epoch boundary are aligned.

The nominal transition count for a 1.5 second epoch is 9,514,032 (for RAFS), requiring a 24-bit counter. But an 11-bit counter would suffice to cover a 100 ppm range of frequency variation, assuming this is needed for start-up situations. More bits, such as 16 bits, would also provide integrity checking.

Interval Measurement

Preferably the transition count and phase measurements are combined to obtain a measurement of the interval length, with the range of the count and precision of the phase. Count adjustment unit 11 performs such a combination. Here, time is measured in units of AFS cycles, with integer time values occurring at rising edges of the AFS clock. FIGS. 8A through 8D show various instances of a clock signal, with differing phases, within a count interval. Various instances of the signal are illustrated by the waveforms shown in FIGS. 8A through 8D. The phase of a signal, here, refers to the fractional part of a cycle of the waveform at the boundary between two counting intervals.

The length of a time interval is the end time minus the beginning time. Accordingly, the phase change (i.e., end phase minus beginning phase) equals the fractional part of the interval length. This suggests that the "interval count" is the integer part of the interval length. The transition count must be translated to the "interval count", then the phase change appended to this count to obtain the final interval measurement.

Ambiguity Problem

The count of transitions approximates the number of half-clock-periods. That is, the count can be divided by two and the result added to the number of periods of the system clock in the interval to estimate, with a resolution of ½ cycle, the number of periods of the AFS clock in the interval. But this result can only be an estimate, because the interval counter equals the actually counted transitions, not half-clock-periods. There is an uncertainty spanning a ½ cycle at each end of the counting interval, plus jitter and rounding error.

For example, consider where time is measured in AFS clock cycles, where the interval length is close to 3.0, and where the phase is close to zero at both ends of the interval. This example is illustrated in FIGS. 8A through 8D.

There are four combinations of count uncertainties shown, with varying transition counts, from which are derived varying estimates of the number of cycles. In the rightmost two columns of FIGS. 8A–D these four combinations are combined with two representative phase-change values close to zero (i.e., 0.99=−0.01 modulo 1.0). In each of these eight cases, the interval measurement that best fits the data are listed; that is, the number of cycles are adjusted to the nearest value that agrees with the measured phase change.

Even though an interval measurement close to 3.0 is usually changed, sometimes a measurement is close to 2.0 or 4.0. Also, if a similar diagram is made for the case where the actual interval length is close to 4.0, the transition counts would be greater by 2, and the cycle counts and interval measurements greater by 1. Thus, the first row of this new table would be the same as the last row of the above table. This demonstrates that the same data can be observed when the actual interval is close to 4.0 as when it is close to 3.0. Hence, the number of transitions does not always clearly indicate the number of cycles, thereby creating an ambiguity as to how many cycles are present in the interval.

Figure 9A:
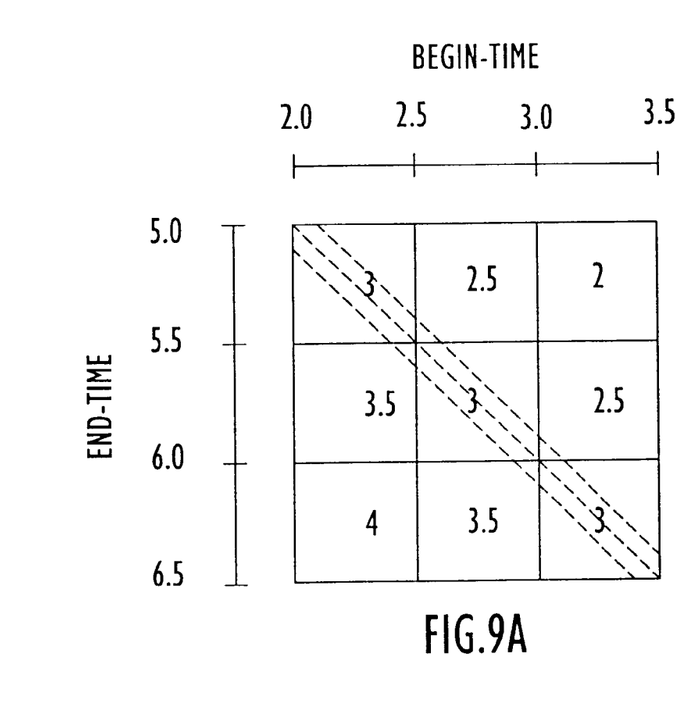
FIGS. 9A–B are interval count diagrams showing a count ambiguity over a count interval.

Another way to understand the ambiguity is to plot the interval count as a function of the times of the beginning and end of the interval, as shown in FIG. 9A. The numbers in the squares in FIG. 9A indicate the number of AFS clock transitions divided by two (scaled to cycles) for various combinations of begin-time and end-time. For example, for begin-times in the range 2.0 . . . 2.5 and end-times in the range 5.0 . . . 5.5, the transition count will be 6. Also, if at end-times in the range 5.0 . . . 5.5, the begin-time changes from 2.49 to 2.51, the transition count will decrease by one, i.e. from 6 to 5. The dotted lines in FIG. 9A correspond to interval lengths of 3.0, and a little more, and a little less. At the position begin-time=2.5 and end-time=5.5, only the phase noise will determine if the result is 2.5, 3.0, or 3.5.

Figure 9B:
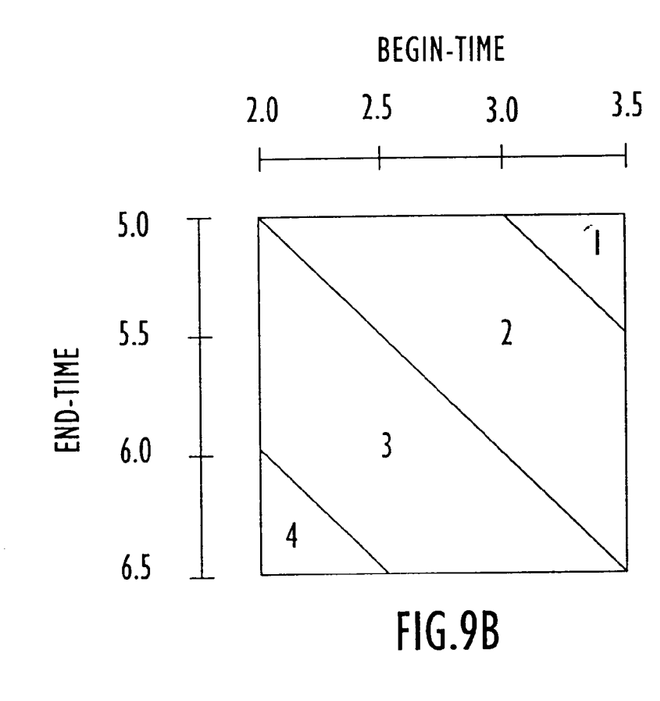

By contrast, FIG. 9B illustrates the interval count provided by the present invention. For example, interval lengths in the range 3.01 . . . 3.99 lie in the sloping area labeled "3". The position of the sloping lines shown in FIG. 9B depend on the measured phase change, which is derived from many samples, but the position of the grid lines in FIG. 9A depend only on the phase of the transitions at the beginning and end of the interval. Thus, the sloping lines may not pass exactly through the grid intersections.

Count Adjustment Logic

The logic described next solves the ambiguity problem by estimating the phase at the beginning and end of each counting interval. Three successive samples spanning each boundary of the intervals provide a coarse phase estimate with a resolution of about ⅙ cycle. By comparing these phase estimates, the count is adjusted so that the sum of the uncertainties at the beginning and end of the counting interval is about +/−0.38 cycle plus jitter. Ambiguity is eliminated by using the same samples used to drive the counter. Finally, the phase change measured by the phase meter (fine phase) is used to adjust the count again so that the adjusted count gives the integer part of the interval length, while the phase change gives the fractional part. The count adjustment process thus has the following three stages, described next:

(1) measure the coarse phase at the beginning and end of the interval;

(2) use the coarse phase to adjust the count; and (3) use the fine phase to adjust the count.

Coarse Phase Measurement

Figure 10:
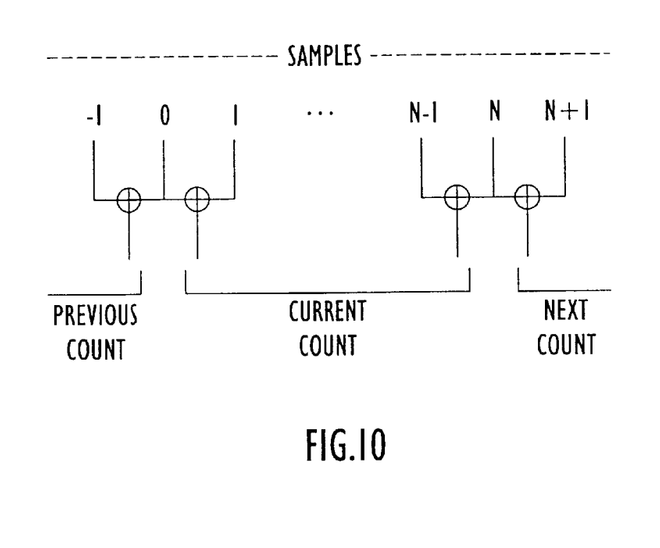
FIG. 10 is a diagram showing how samples are counted.

The course phase measurement is described with reference to FIG. 10, in which samples are exclusive-or'ed. In FIG. 10 the samples are numbered as follows: The first exclusive-or counted in the interval is the exclusive-or of samples 0 and 1, and the last exclusive-or counted in the interval is the exclusive-or of samples N−1 and N, where N is the number of samples in the current counting interval. Thus, the previous count ended with the exclusive-or of samples −1 and 0, and the next count will start with the exclusive-or of samples N and N+1. If a transition is moved across the boundary between the previous and current count intervals, it changes sample 0, which changes the previous and current counts in opposite directions. The same applies to the boundary between the current and next count intervals, at sample N.

Figure 11:
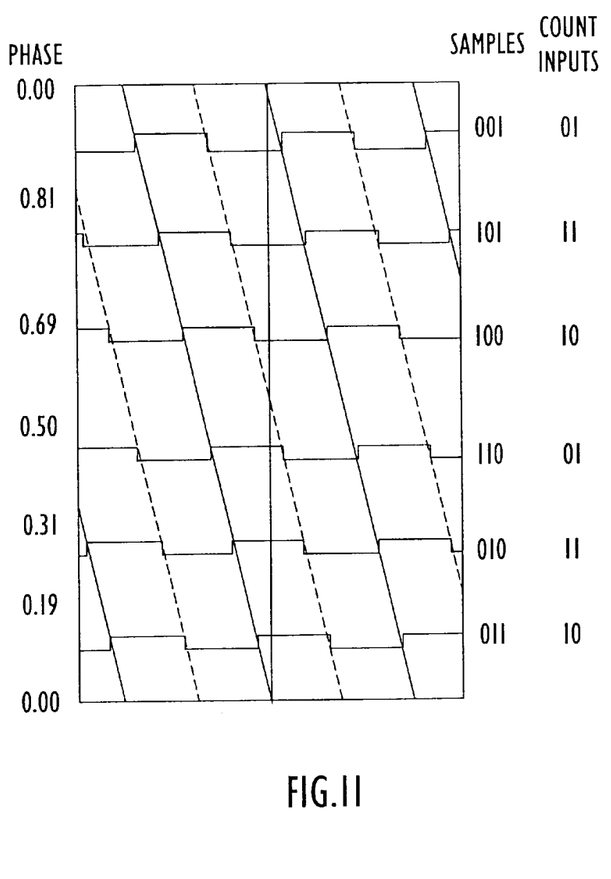
FIG. 11 is a waveform diagram showing various phase offsets of a signal and the counts for those offsets.

FIG. 11 illustrates the situation at each boundary, and shows time horizontally for two periods of the system clock, and shows phase vertically for one cycle. The three vertical lines represent three successive edges of the system clock that sample the AFS clock, and correspond to samples −1, 0, and 1 (plus a multiple of N for other boundaries). The middle vertical line represents the boundary between two counting intervals. The slanting lines represent the rising and falling edges of the AFS clock.

Since the six sample sequences shown on the right side of FIG. 11 are distinct, and since the six ranges are fairly uniform, this diagram demonstrates that three consecutive samples can be used to measure the phase to about ⅙ cycle resolution. The three sample bits can be used as a phase code spanning one cycle with ⅙ cycle resolution, or the two count-input bits can be used as a phase code spanning ½ cycle with ⅙ cycle resolution.

First Count Adjustment

Figure 12A:
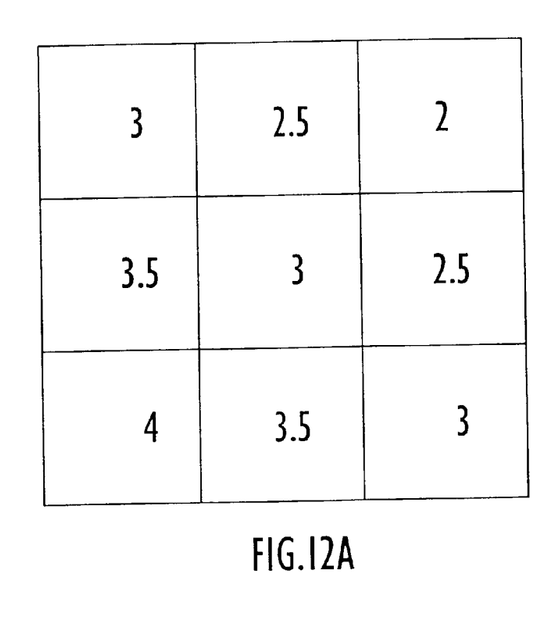
FIGS. 12A–D are interval count diagrams relating to coarsely adjusted interval counts.

The two-bit coarse phase codes are used to adjust the interval count as shown in FIG. 12A. First, for reference, FIG. 12A is a simplified version of FIG. 9A. Again, phase is considered the fractional part of time when measuring the time of interval boundaries (selected system clock edges) using the AFS clock edges as the "time ruler". The coarse phase codes provide more time resolution and can be used to improve the interval measurements represented by FIG. 12A.

Figure 12B:
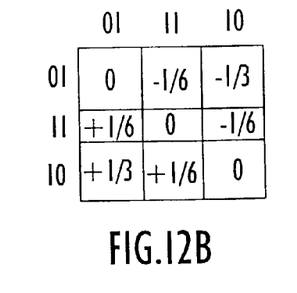

For example, FIG. 12B shows how each square of FIG. 12A can be sub-divided. Each column of FIG. 12B corresponds to one of the phase code values for the beginning of the interval, and each row of FIG. 12B corresponds to one of the phase code values for the end of the interval. The values shown in FIG. 12B represent adjustments that can be applied to each square of FIG. 12A to improve its resolution. For example, if the square of FIG. 12B is conceptually placed on top of one of the "2.5" squares of FIG. 12A, and the adjustment values are added to the 2.5 value, values are obtained ranging from 2⅙ to 2⅚ in the various subregions.

Figure 12C:
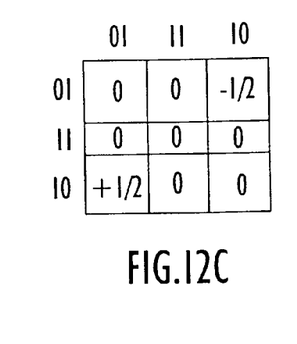
Figure 12D:
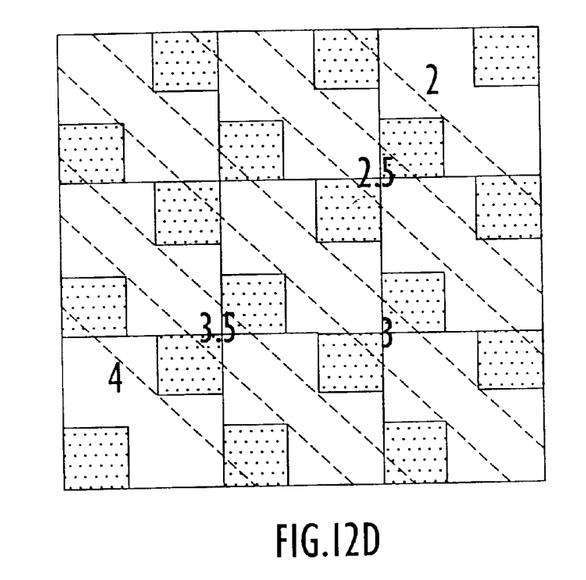

FIG. 12C shows a simpler method, where the adjustments are rounded off to the nearest multiple of ½. Thus, +⅙ and −⅙ round off to 0, and +⅓ and −⅓ round off to +½ and −½, respectively. Because the values of FIG. 12A are also multiples of ½, no new values are created by applying these adjustments. For example, the bottom left corner of the "2" square is adjusted to 2.5, and the top right corners of the "3" squares are also adjusted to 2.5. The result is that the "2.5" regions of FIG. 12A are merged into one well-connected region, as shown in FIG. 12D, where the adjusted regions are shown by shading. The same process is performed for all of the regions.

Unlike in FIG. 12A, there is no position in FIG. 12D where regions "2.5" and "3.5" (for example) are close, so that a little jitter can change the result by an entire cycle. In FIG. 12A the actual interval lengths included in region(s) "3" range from 2.5 to 3.5, showing that the count before adjustment estimates the interval length with errors ranging from −0.5 to +0.5. However, in FIG. 12D the actual interval lengths included in region "3" range from 2.62 to 3.38, showing that the count after adjustment estimates the interval length with errors ranging from −0.38 to +0.38.

Second Count Adjustment

Figure 13A:
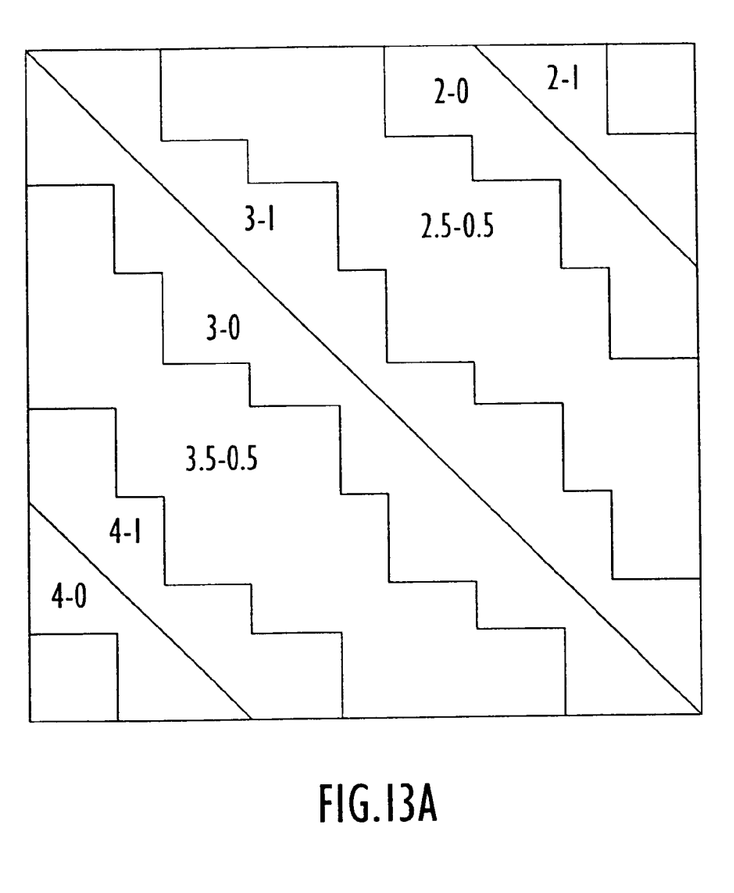
FIGS. 13A and B are interval count diagrams relating to finely adjusted interval counts.
Figure 13B:
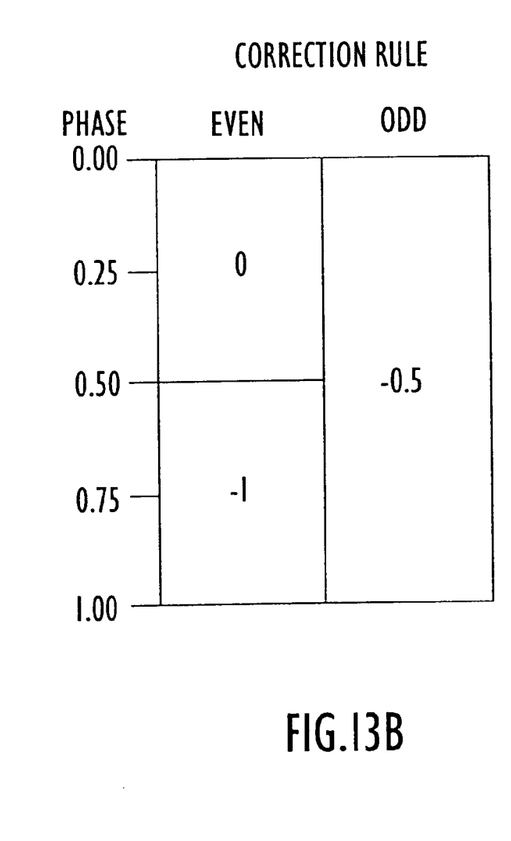

FIGS. 13A and 13B show how to convert from the adjusted transition count shown (scaled to cycles) in FIG. 12D to the "interval count" as shown in FIG. 9B. The labels of the regions shown in FIG. 13A have the form X-Y, where X is the interval measurement adjusted according to FIG. 12D, and -Y is a second adjustment defined in FIG. 13B. This final adjustment depends on the fine phase change measurement and whether the transition count is even (NNN.0 after scaling) or odd (NNN.5 after scaling). It is easily verified that X minus Y always results in the "interval count" shown in FIG. 9B. The phase change measurement can be added to this count to obtain the final interval measurement. The sloping lines, which depend on the fine phase measurement, do not pass through, or even near any of the grid lines (horizontal and vertical lines), which depend on the transition count and coarse phase codes. This allows for discrepancies between the fine and coarse phase data.

Having described preferred embodiments of a phase meter using a permuter and a matched filter, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in their ordinary and accustomed manner only, unless expressly defined differently herein, and not for purposes of limitation.

What is claimed is:

1. A phase meter for measuring a phase of a first signal having a first frequency with respect to a second signal having a second frequency, comprising:
   a sampler sampling the first signal based on the second signal and outputting a plurality of samples;
   a permuter coupled to the sampler and permuting the plurality of samples based on the frequencies of the first and second signals, and outputting permuted samples;
   a filter coupled to the permuter, filtering the permuted samples and outputting a phase measurement signal.

2. The phase meter of claim 1, wherein the permuter permutes the plurality of samples according to $j=A*i$ modulo C1, where C2/C1 approximates F1/F2, C1 and C2 are integers, F1 is the frequency of the first signal, F2 is the frequency of the second signal, and $A=C2$ modulo C1.

3. The phase meter of claim 1, wherein the filter is a matched filter.

4. The phase meter of claim 1, wherein the filter determines a duty-cycle of the first signal based on the filtered permuted samples, and outputs a duty-cycle signal.

5. The phase meter of claim 1, further comprising:
   an interval counter coupled to the sampler, and determining a number of cycles of the first signal within an interval, based on a number of transitions in the first signal determined from the plurality of samples;
   a count adjusting unit coupled to the interval counter, sampler and filter, adjusting the number of cycles determined by the interval counter, based on the phase measurement signal and the plurality of samples, and outputting an interval measurement based on the adjusted number of cycles.

6. The phase meter of claim 1, wherein the filter sums sequences of the plurality of samples, and determines a maximum and a minimum of the sums, and outputs the phase measurement signal based on at least one of the determined maximum and minimum sums.

7. The phase meter of claim 6, wherein the filter averages the maximum and minimum sums and outputs the average as the phase measurement signal.

8. The phase meter of claim 1, wherein the permuter comprises:
   a shift register storing the plurality of samples output from the sampler; and
   a multiplexer having a plurality of data inputs connected to the shift register, a plurality of data outputs, and a selection input, wherein the multiplexer, in response to a selection signal applied to the selection input, outputs the plurality of samples in a permuted order.

9. The phase meter of claim 8, wherein the selection signal controls the multiplexer to output at the multiplexer's output position j a signal input to an input position i of the multiplexer, where $j=A*i$ modulo C1, where C2/C1 approximates F1/F2, C1 and C2 are integers, F1 is the frequency of the first signal, F2 is the frequency of the second signal, and $A=C2$ modulo C1.

10. The phase meter of claim 8, wherein the shift register is connected to the data inputs of the multiplexer according to $j=A*i$ modulo C1, where i is a storage position in the shift register and j is one of the plurality of data inputs of the multiplexer, and where C2/C1 approximates F1/F2, C1 and C2 are integers, F1 is the frequency of the first signal, F2 is the frequency of the second signal, and $A=C2$ modulo C1.

11. A method of measuring a phase of a first signal having a first frequency with respect to a second signal having a second frequency, comprising:

sampling the first signal with the second signal to produce a plurality of samples;

permuting the plurality of samples based on the first and second frequencies;

filtering the permuted samples; and outputting a phase measurement signal based on the filtered permuted samples.

12. The method of claim 11, wherein the plurality of samples are permuted according to j=A*i modulo C1, where i is a position of one of the plurality of samples, j is the permuted sample, C2/C1 approximates F1/F2, C1 and C2 are integers, F1 is a frequency of the first signal, F2 is a frequency of the second signal, and A=C2 modulo C1.

13. The method of claim 11, further comprising:

determining a number of cycles of the first signal within an interval based on a number of transitions in the first signal determined from the plurality of samples;

adjusting the determined number of cycles based on the phase measurement signal and the plurality of samples, and outputting an interval measurement based on the adjusted number of cycles.

14. The method of claim 11, further comprising:

determining a duty cycle of the first signal based on the filtering of the permuted samples; and outputting a duty cycle signal based on the determined duty cycle.

15. The method of claim 11, wherein the filtering includes:

storing a sequence of the plurality of samples;

summing the sequence of stored samples;

repeating said storing and summing operations a plurality of times;

determining at least one of a maximum and minimum of the sums; and generating the phase measurement signal based on the determined sum.

16. The method of claim 15, wherein the filtering further includes averaging the minimum and maximum sums and outputting the average sum as the phase measurement signal.

* * * * *